(12) United States Patent
Muthiah et al.

(10) Patent No.: US 12,188,983 B1
(45) Date of Patent: Jan. 7, 2025

(54) METHOD AND SYSTEM FOR CONTROLLING ACTIONS OF TESTBENCH COMPONENTS WITHIN A TEST ENVIRONMENT

(71) Applicant: HCL America Inc., Sunnyvale, CA (US)

(72) Inventors: Manickam Muthiah, Shrewsbury, MA (US); Karthikeyan Keelapandal Sundaram, Chennai (IN); Nisha Ravichandran, Hudson, MA (US); Sathish Kumar Krishnamoorthy, Madurai (IN); Razi Abdul Rahim, Willowbrook, IL (US)

(73) Assignee: HCL America Inc.

( * ) Notice: Subject to any disclaimer, the term of this patent is extended or adjusted under 35 U.S.C. 154(b) by 0 days.

(21) Appl. No.: 18/209,542

(22) Filed: Jun. 14, 2023

(51) Int. Cl.
| | |
|---|---|
| *G01R 31/3185* | (2006.01) |
| *G01R 31/317* | (2006.01) |
| *G01R 31/3183* | (2006.01) |
| *G01R 31/319* | (2006.01) |

(52) U.S. Cl.
CPC ........ *G01R 31/318314* (2013.01); *G01R 31/31704* (2013.01); *G01R 31/31707* (2013.01); *G01R 31/31719* (2013.01); *G01R 31/31912* (2013.01)

(58) Field of Classification Search
CPC ...... G01R 31/318314; G01R 31/31707; G01R 31/31704
See application file for complete search history.

(56) References Cited

U.S. PATENT DOCUMENTS

| | | | |
|---|---|---|---|
| 6,269,467 B1* | 7/2001 | Chang | G06F 30/33 716/136 |
| 7,188,041 B1* | 3/2007 | Secatch | G01R 31/318314 702/108 |
| 2002/0183956 A1* | 12/2002 | Nightingale | H04L 43/50 702/120 |
| 2004/0015739 A1 | 1/2004 | Heinkel et al. | |

(Continued)

FOREIGN PATENT DOCUMENTS

IN 201711007116 A 3/2017

OTHER PUBLICATIONS

MiIRZA Aamir Mehmood, M.N.A Khan, Wasif Afzal; Automating Test Data Generation for Testing Context-Aware Applications; 2018 IEEE Xplore; Mar. 10, 2019; 104-108; IEEE; China.

(Continued)

*Primary Examiner* — Joseph D Torres
(74) *Attorney, Agent, or Firm* — Kendal M. Sheets (57) ABSTRACT

A method and system for controlling actions of testbench components present within a test environment based on a testing context is disclosed. In some embodiments, the method includes receiving a controllable actions packet from each of a plurality of testbench components in the test environment; parsing a testing context associated with a test sequence; generating a context-based actions control packet for each of the plurality of testbench components, based on the testing context metadata and the list of controllable actions corresponding to each of the plurality of testbench components; and transmitting the context-based actions control packet to an associated testbench component of the plurality of testbench components.

16 Claims, 8 Drawing Sheets

(56) References Cited

U.S. PATENT DOCUMENTS

| | | | |
|---|---|---|---|
| 2005/0198611 A1* | 9/2005 | Ebert | G01R 31/318314 |
| | | | 714/E11.159 |
| 2009/0168657 A1* | 7/2009 | Puri | G06F 11/263 |
| | | | 370/248 |
| 2013/0097568 A1* | 4/2013 | Yang | G06F 30/33 |
| | | | 716/113 |
| 2018/0225394 A1 | 8/2018 | Verma | |
| 2020/0379886 A1 | 12/2020 | Potter et al. | |

OTHER PUBLICATIONS

Stefan Taranu, Jens Tiemann; General method for testing context aware applications; ResearchGate;Jun. 2009.

* cited by examiner

METHOD AND SYSTEM FOR CONTROLLING ACTIONS OF TESTBENCH COMPONENTS WITHIN A TEST ENVIRONMENT

TECHNICAL FIELD

Generally, the invention relates to functional simulation. More specifically, the invention relates to method and system for controlling actions of testbench components present within a test environment based on a testing context.

BACKGROUND

Today, simulations are used to test a device or a system. A simulation provides information about functional correctness of a Device Under Test (DUT) or a System Under Test (SUT) connected in a test environment. The test environment includes various testbench components, such as drivers, monitors, scoreboards, and the like. Typically, the testbench components do not have information about testing context. For example, information about the test in terms of number of packets used for different DUT input interfaces, type of test (i.e., a long running test or a short running test), criticality of the test, etc. Therefore, the testbench components continue to perform their operations for every test irrespective of the testing context. Hence, the testbench components might not be able to add value to testing based on the testing context for each test.

For example, currently, the testbench components lack adjusting logging automatically for a long running test based on the testing context. The long running tests tend to generate logs that require more disk space for storing them. Further, a monitor (i.e., the testbench component) on an interface that is not exercised during a test lack automatically flagging an error when there is an unexpected transaction detected on the interface. Therefore, the testbench components are manually configured or controlled to take appropriate actions based on the testing context. However, configuring or controlling the testbench components manually may require human efforts and sometimes may be error prone.

SUMMARY OF INVENTION

In one embodiment, a method for controlling actions of testbench components present within a test environment based on a testing context is disclosed. The method may include receiving a controllable actions packet from each of a plurality of testbench components in the test environment. The controllable actions packet may include a list of controllable actions corresponding to a testbench component. The method may further include parsing a testing context associated with a test sequence. The testing context may be parsed to generate testing context metadata. The method may further include generating a context-based actions control packet for each of the plurality of testbench components, based on the testing context metadata and the list of controllable actions corresponding to each of the plurality of testbench components. The method may further include transmitting the context-based actions control packet to an associated testbench component of the plurality of testbench components. The context-based actions control packet may include one or more actions to be performed by the associated testbench component.

In another embodiment, a method for performing actions through testbench components present within a test environment based on a testing context is disclosed. The method may include sending, by each of a plurality of testbench components to an actions controller, an associated controllable actions packet. The controllable actions packet may include a list of controllable actions corresponding to a testbench component. The method may further include receiving, by each of the plurality of testbench components from the actions controller, an associated context-based actions control packet in response to sending. It should be noted that the context-based actions control packet may include one or more actions to be performed. Also, it should be noted that the context-based actions control packet for each of the plurality of testbench components may be generated, based on testing context metadata and the list of controllable actions corresponding to each of the plurality of testbench components. Further, the testing context metadata may be generated based on a testing context associated with a test sequence received from a user. The method may further include configuring each of the plurality of testbench components based on the associated context-based actions control packet. The method may further include performing, by each of the plurality of testbench components, the one or more actions present within the associated context-based actions control packet.

In another embodiment, a system for controlling actions of testbench components present within a test environment based on a testing context is disclosed. The system may include a processor and a memory communicatively coupled to the processor. The memory may store processor-executable instructions, which, on execution, may cause the processor to receive a controllable actions packet from each of a plurality of testbench components in the test environment. The controllable actions packet may include a list of controllable actions corresponding to a testbench component. The processor-executable instructions, on execution, may further cause the processor to parse a testing context associated with a test sequence. The testing context may be parsed to generate testing context metadata. The processor-executable instructions, on execution, may further cause the processor to generate a context-based actions control packet for each of the plurality of testbench components, based on the testing context metadata and the list of controllable actions corresponding to each of the plurality of testbench components. The processor-executable instructions, on execution, may further cause the processor to transmit the context-based actions control packet to an associated testbench component of the plurality of testbench components. The context-based actions control packet may include one or more actions to be performed by the associated testbench component.

In yet another embodiment, a system for performing actions through testbench components present within a test environment based on a testing context is disclosed. The system may include a processor and a memory communicatively coupled to the processor. The memory may store processor-executable instructions, which, on execution, may cause the processor to send, by each of a plurality of testbench components to an actions controller, an associated controllable actions packet. The controllable actions packet may include a list of controllable actions corresponding to a testbench component. The processor-executable instructions, on execution, may further cause the processor to receive, by each of the plurality of testbench components from the actions controller, an associated context-based actions control packet in response to sending. It should be noted that the context-based actions control packet may include one or more actions to be performed. Also, it should be noted that the context-based actions control packet for each of the plurality of testbench components may be generated, based on testing context metadata and the list of controllable actions corresponding to each of the plurality of testbench components. Further, the testing context metadata may be generated based on a testing context associated with a test sequence received from a user. The processor-executable instructions, on execution, may further cause the processor to configure each of the plurality of testbench components based on the associated context-based actions control packet. The processor-executable instructions, on execution, may further cause the processor to perform, by each of the plurality of testbench components, the one or more actions present within the associated context-based actions control packet.

It is to be understood that both the foregoing general description and the following detailed description are exemplary and explanatory only and are not restrictive of the invention, as claimed.

BRIEF DESCRIPTION OF THE DRAWINGS

The present application can be best understood by reference to the following description taken in conjunction with the accompanying drawing figures, in which like parts may be referred to by like numerals.

DETAILED DESCRIPTION OF THE DRAWINGS

The following description is presented to enable a person of ordinary skill in the art to make and use the invention and is provided in the context of particular applications and their requirements. Various modifications to the embodiments will be readily apparent to those skilled in the art, and the generic principles defined herein may be applied to other embodiments and applications without departing from the spirit and scope of the invention. Moreover, in the following description, numerous details are set forth for the purpose of explanation. However, one of ordinary skill in the art will realize that the invention might be practiced without the use of these specific details. In other instances, well-known structures and devices are shown in block diagram form in order not to obscure the description of the invention with unnecessary detail. Thus, the invention is not intended to be limited to the embodiments shown, but is to be accorded the widest scope consistent with the principles and features disclosed herein.

While the invention is described in terms of particular examples and illustrative figures, those of ordinary skill in the art will recognize that the invention is not limited to the examples or figures described. Those skilled in the art will recognize that the operations of the various embodiments may be implemented using hardware, software, firmware, or combinations thereof, as appropriate. For example, some processes can be carried out using processors or other digital circuitry under the control of software, firmware, or hard-wired logic. (The term "logic" herein refers to fixed hardware, programmable logic and/or an appropriate combination thereof, as would be recognized by one skilled in the art to carry out the recited functions.) Software and firmware can be stored on computer-readable storage media. Some other processes can be implemented using analog circuitry, as is well known to one of ordinary skill in the art. Additionally, memory or other storage, as well as communication components, may be employed in embodiments of the invention.

Figure 1:
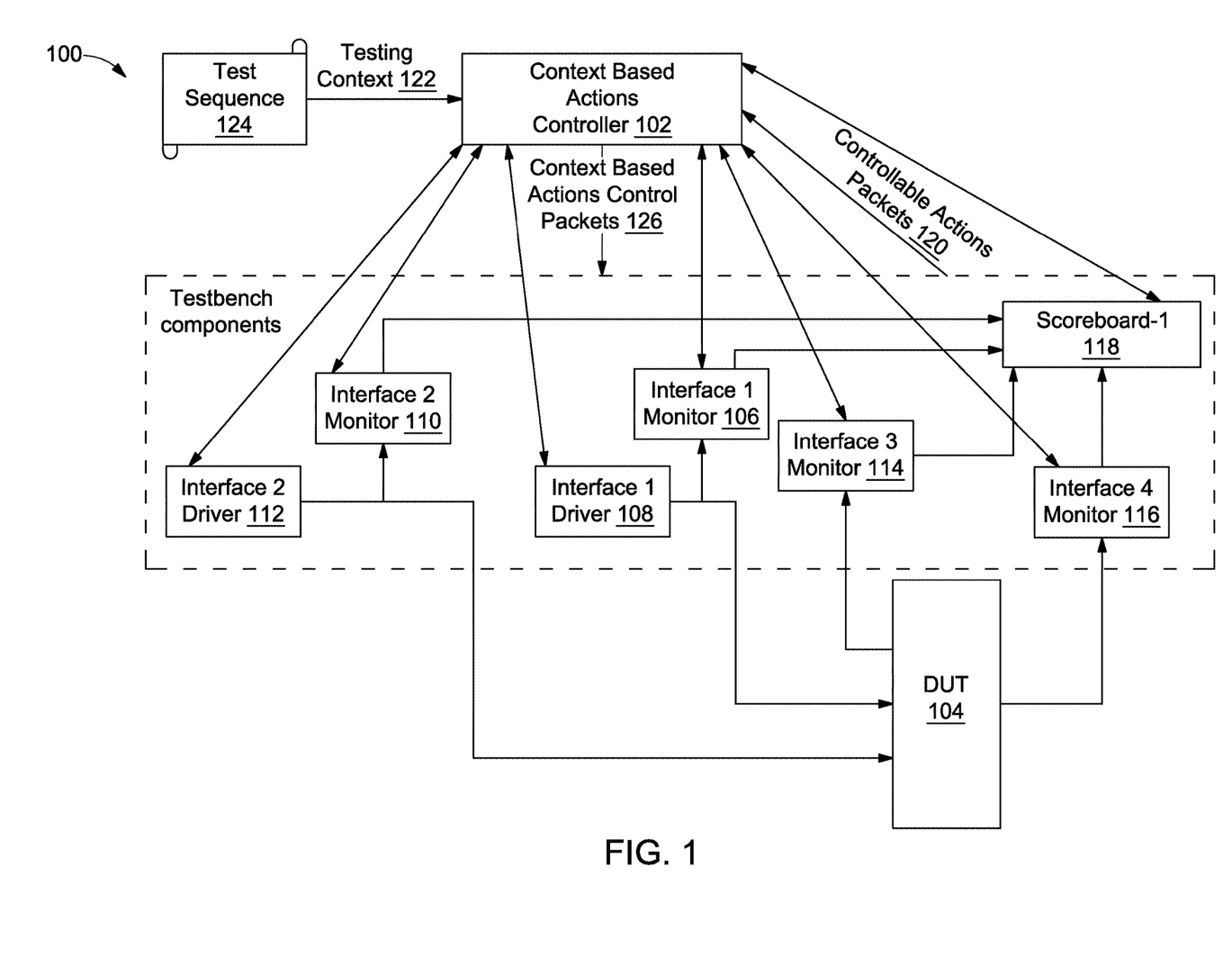
FIG. 1 is a block diagram illustrating a system for controlling actions of testbench components present within a test environment based on a testing context, in accordance with an embodiment.

Referring now to FIG. 1, a block diagram of a system 100 for controlling actions of testbench components present within a test environment based on a testing context is illustrated, in accordance with an embodiment. The system 100 may include a context-based actions controller 102, a Device Under Test (DUT) 104, the testbench components employed to test the DUT 104 in the test environment. In an embodiment, the context-based actions controller 102 may correspond to an action's controller. The testbench components employed to test the DUT 104 may include an interface 1 monitor 106, an interface 1 driver 108, an interface 2 monitor 110, an interface 2 driver 112, an interface 3 monitor 114, an interface 4 monitor 116, and a scoreboard-1 118.

In an embodiment, in order to control actions of the testbench components, initially, the context-based action controller 102 may be configured to receive a controllable actions packet from each of the testbench components. A controllable actions packet may include a unique name of an associated testbench component, an object handle to access the testbench component, and a list of actions to be performed by the testbench components. Examples of the controllable actions' packets are depicted and explained in detail in conjunction with FIG. 8. As depicted via the present FIG. 1, the controllable actions packet corresponding to each of the testbench components may correspond to controllable actions packets 120.

It should be noted that, one testbench component may be responsible for sending one corresponding controllable actions packet of the controllable actions packets 120 associated with that testbench component. By way of an example, the testbench component 'the interface 1 monitor 106' may be configured to send the corresponding controllable actions packet to the context-based actions controller 102. Further, the controllable actions packets 120 may include the controllable action packet associated with each testbench component, i.e., 'the Interface 1 monitor 106, the Interface 1 driver 108, the Interface 2 monitor 110, the Interface 2 driver 112, the Interface 3 monitor 114, the Interface 4 monitor 116, and the scoreboard-1 118".

On the other hand, the context-based actions controller 102 may also receive a testing context 122 along with a test sequence 124 from a user. In an embodiment, the test sequence 124 may correspond to an input sequence provided by the user for testing the DUT 104. For example, the testing context 122 provided by the user may include, number of packets to be used for different input interfaces (such as the interfaces associated with 'Interface 1 driver 108' and 'Interface 2 driver 112') of the DUT 104, long/short running test, critical or non-critical test, interface or function to be tested, any information about the test. In an embodiment, the test may correspond to a simulation. Examples of the testing context may include, but is not limited to, "Interface1 Only Test, 75 Input Packets, Short Running, Interface2 Inactive", "Critical Test, Enable Wave Dump", "Interface2 Error Test", "Long Running. Optimal Logging", and "Sanity Test, No DUT Output".

Upon receiving the controllable actions packets 120 corresponding to each of the testbench components and the texting context, the context-based actions controller 102 may generate context-based actions control packets 126, for the testbench components after receiving the controllable actions packets 120 from the testbench components. In other words, the context-based actions controller 102 may generate one context-based actions control packet from the context-based actions control packets 126 corresponding to one testbench component from the testbench components upon receiving the corresponding controllable actions packet. In contribution to above example, upon receiving the controllable actions packet for the testbench component, i.e., 'the interface 1 monitor 106', the context-based actions controller 102 may be configured to generate the corresponding context-based actions control packet for 'the interface 1 monitor 106'. Examples of the context-based actions control packets 126 are depicted and explained in detail in conjunction with FIG. 9. It should be noted that various operations may be performed by the context-based actions controller 102 to generate the context-based actions control packets 126. For example, the operations may include receiving the controllable actions packets 120, receiving the testing context 122, parsing the testing context 122, extracting data from the controllable actions packets 120, and the like. Generation of the context-based actions control packets 126 is further explained in detail in conjunction with FIG. 2.

Further, the context-based actions controller 102 may transmit the generated context-based actions control packets 126 to the testbench components. In other words, the context-based actions controller 102 may transmit the context-based actions control packet of the context-based actions control packets 126 to the corresponding testbench component of the testbench components. In continuation to above example, when the context-based actions control packet corresponding to the testbench component, i.e., 'Interface 1 monitor 106' is generated, then the context-based actions controller 102 may transmit the generated context-based actions control packet to the 'Interface 1 monitor 106'. In an embodiment, each of the context-based action control packets 126 may include one or more action control settings defining the one or more actions required to be performed by the associated testbench component. It may be noted that the context-based actions control packets 126 are generated for the testbench components based on testing context metadata and the list of controllable actions corresponding to each of the testbench components. The testing context metadata may be generated based on the testing context 122 associated with the test sequence 124 received from the user.

For example, a context-based actions control packet 'A' may be sent to a testbench component (for example, to the interface 1 driver 108) in response to receiving a controllable actions packet 'A' associated with the interface 1 driver 108 from the interface 1 driver 108. Here, the controllable actions packet 'A' may include the unique name, the object handle, and the list of actions associated with interface 1 driver 108, and the context-based actions control packet 'A' may include one or more action control settings defining actions required to be performed by the interface 1 driver 108.

By way of another example, a context-based actions control packet 'N' may be sent to the scoreboard-1 118 in response to receiving a controllable actions packet 'N' from the scoreboard-1 118. Here, the controllable actions packet 'N' may include the unique name, the object handle, and the list of actions associated with scoreboard-1 118, and the context-based actions control packet 'N' may include one or more action control settings defining actions required to be performed by the scoreboard-1 118. It should be noted that in that case the context-based action control packets 'A' and 'N' may be two context-based actions control packets (corresponding to the interface 1 driver 108 and the scoreboard-1 118, respectively) within the context-based actions control packets 126.

Further, each testbench component of the testbench components may be configured based on the associated context-based actions control packet. Upon configuring, each testbench component may perform one or more actions present within the associated context-based actions control packet. With regards to the one or more actions, a result of the one or more actions performed by the each testbench component may be generated and transmitted further to the user, at an end of a simulation (i.e., a test run). The result generated corresponding to the one or more actions performed by the testbench component may be used by the user for performing further analysis. In other words, the result generated corresponding to the one or more actions performed by the testbench component may enable the user to identify an issue with respect to the testbench component. In addition, the result generated corresponding to each testbench component may enable the user to identify reason for failure of the simulation or to enable comparing results of two different simulations.

By way of an example, the context-based actions controller 102 may signal an interface driver. The signal includes that it is expected to send a specific number of packets into the DUT 104 and report an error if it is not able accomplish that before ending the test. By way of another example, the context-based actions controller 102 may transmit a signal to the scoreboard-1 118 that the test injects one or more errors into the DUT 104 and the scoreboard-1 118 needs to perform appropriate checking based on the errors injected. By way of another example, the context-based actions controller 102 may signal the scoreboard-1 118 that it is expected to detect a specific number of DUT output packets and report an error if the respective number of packets is not detected before end of the test.

Moreover, additional configurations may be applied to the testbench components during run-time by the context-based actions controller 102 based on the testing context 122 set by the user. For example, the timeout value for the testbench component, e.g., the interface 2 driver 112 may be increased based on the testing context, when the interface 2 driver 112 is expected to wait longer because of congestion in the DUT 104 leading to delayed release of the interface 2 driver 112 credits.

Figure 2:
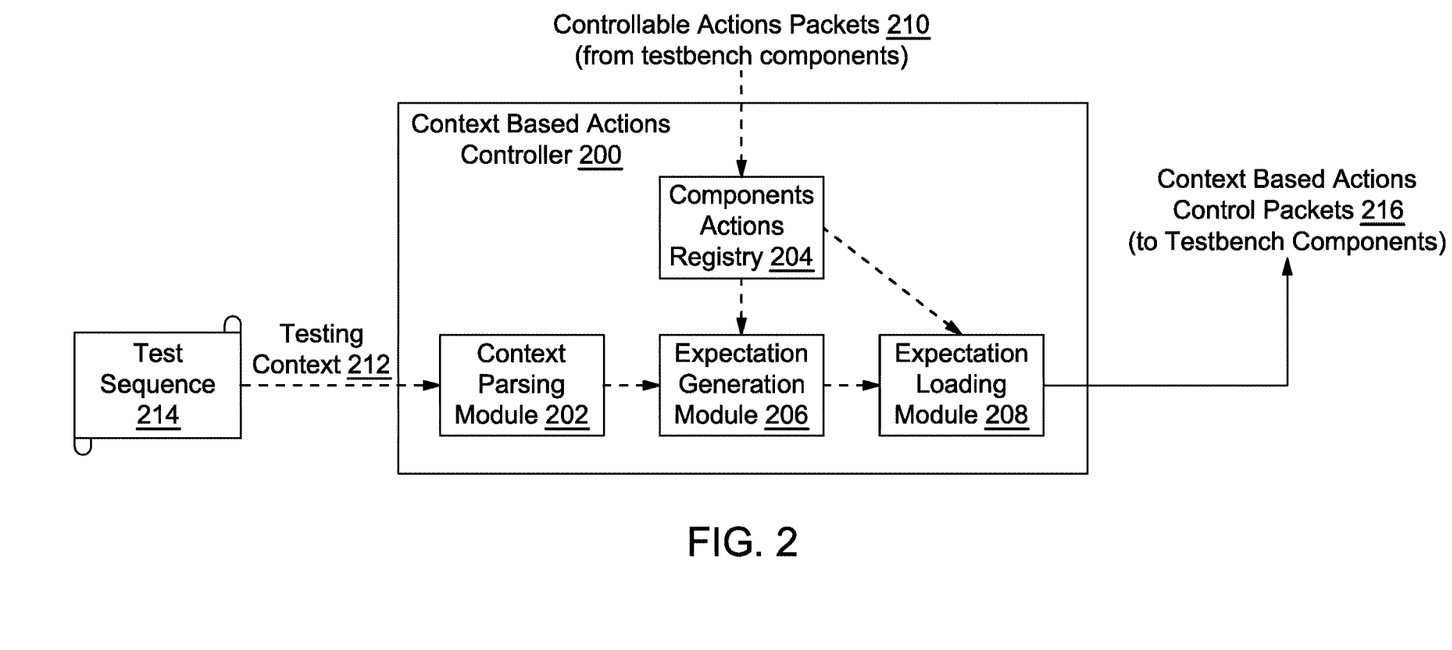
FIG. 2 is a functional block diagram of various modules within a context-based actions controller configured to control actions of testbench components, in accordance with an embodiment.

Referring now to FIG. 2, a block diagram of various modules within a context-based actions controller 200 (analogous to the context-based actions controller 102) configured to control actions of testbench components is illustrated, in accordance with an embodiment. In order to control actions of the testbench components, the context-based actions controller 200 may include a context parsing module 202, a components' actions registry 204, an expectation generation module 206, and an expectation loading module 208. FIG. 2 is explained in conjunction with FIG. 1.

In some embodiments, the context parsing module 202 may be configured to receive a testing context 212. The testing context 212 may be associated with a test sequence 214 and provided by a user. In other words, the testing context 212 may be set by the user in advance for the simulation. Further, the context parsing module 202 may be configured to parse the testing context 212. The testing context 212 may be parsed to generate testing context metadata. The context parsing module 202 may be communicatively coupled the expectation generation module 206. Further, the context parsing module 202 may be configured to send the generated testing context metadata to the expectation generation module 206.

The components' actions registry 204 may be configured to store controllable actions packets 210 (same as the controllable actions packets 120) received from the testbench components. It should be noted that, each of the testbench components may send the associated controllable actions packet, at start of the simulation. With reference to FIG. 1, the testbench components may correspond to 'the Interface 1 monitor 106', 'the Interface 1 driver 108', 'the Interface 2 monitor 110', 'the Interface 2 driver 112', 'the Interface 3 monitor 114', 'the Interface 4 monitor 116', and 'the scoreboard-1 118'. A controllable actions packet includes a unique name of a testbench component, an object handle to access the testbench component, and a list of controllable actions (i.e., functions) to be performed by the testbench component. The components' actions registry 204 may be operatively coupled to the expectation generation module 206.

In one embodiment, the expectation generation module 206 may be configured to extract the controllable actions packets corresponding the testbench components from the components' actions registry 204. In another embodiment, the expectation generation module 206 may be configured to receive the testing context metadata from the context parsing module 202. Further, upon receiving the controllable actions packets and the texting context metadata, the expectation generation module 206 may be configured to generate a context-based actions control packet for each of the testbench components based on the testing context metadata and the list of controllable actions corresponding to each of the testbench components.

With reference to FIG. 1, the context-based actions control packet generated for each of the testbench components may correspond to one of the context-based actions control packets 216. In an embodiment, the context-based actions control packet may include one or more action control settings. The one or more actions control settings may define actions required to be performed by the associated testbench component. The one or more action control settings may correspond to expectation settings. Therefore, in other words, the expectation generation module 206 may generate the expectation settings for each of the testbench components. The expectation settings may be collection of value settings for each controllable action of the respective testbench component.

In particular, the expectation generation module 206 may extract the unique name and the list of controllable actions associated with the testbench component from the associated controllable actions packet. Further, the expectation generation module 206 may analyze the testing context metadata based on the unique name and the list of controllable actions associated with the testbench component. Further, based on the analysis, the expectation generation module 206 may generate the context-based actions control packet for the testbench component. The expectation generation module 206 may be communicatively coupled to the expectation loading module 208. Additionally, the expectation generation module 206 may be configured to send the context-based actions control packet generated for each of the testbench components to the expectation loading module 208.

The expectation loading module 208 may be configured to receive the context-based action control packets from the expectation generation module 206. Further, the expectation loading module 208 may be configured to transmit the context-based actions control packet to the associated testbench component of the testbench components. The context-based actions control packet may include one or more actions to be performed by the associated testbench component. In detail, the expectation loading module 208 may retrieve the object handle associated with the testbench component from the associated controllable actions packet. In an embodiment, the object handle may correspond to an address with which the respective testbench component is accessed. Further, the expectation loading module 208 may be configured to transmit the context-based actions control packet to the associated testbench component of the testbench components based on the retrieved object handle. Further, based on the context-based actions control packet, the testbench component may be configured to perform the one or more actions.

By way of an example, consider a case, when the context-based actions controller 200 may send a signal to an Interface monitor (e.g., the Interface 1 monitor 106) to not expect any transaction on the respective interface1 and report an error if any transaction is identified. In an embodiment, the signal may correspond to an action received by the Interface 1 monitor 106 in form of the context-based actions control packet. As will be appreciated, the context-based actions controller 200 may send the signal via the object handle associated with the 'Interface 1 monitor 106'. Moreover, the object handle may be received by the context-based actions controller 200 in the controllable actions packet received from the 'Interface 1 monitor 106', at the start of the simulation. In such case, as the 'Interface 1 monitor 106' is not expected to be exercised during the simulation (or the test) based on the received signal. Further, the Interface 1 monitor 106 that is not expected to be exercised during the simulation, if seen active, may flag an error based on the signal received from the context-based actions controller 200.

The testbench components, upon receiving the context-based actions control packets from the expectation loading module 208, may use the expectation settings (i.e., the one or more action control settings) from the context-based actions control packets to take appropriate actions. At the end of the simulation, each testbench component may report the result generated corresponding to the one or more actions taken by the testbench components based on the expectation settings to the user.

It should be noted that the system 100 and associated context-based actions controller 102 (same as the context-based action controller 200) may be implemented in programmable hardware devices such as programmable gate arrays, programmable array logic, programmable logic devices, or the like. Alternatively, the system 100 and the context-based actions controller 102 may be implemented in software for execution by various types of processors. An identified engine/module of executable code may, for instance, include one or more physical or logical blocks of computer instructions which may, for instance, be organized as an object, module, procedure, function, or other construct. Nevertheless, the executables of an identified engine/module need not be physically located together but may include disparate instructions stored in different locations which, when joined logically together, comprise the identified engine/module and achieve the stated purpose of the identified engine/module. Indeed, an engine or a module of executable code may be a single instruction, or many instructions, and may even be distributed over several different code segments, among different applications, and across several memory devices.

As will be appreciated by one skilled in the art, a variety of processes may be employed to control actions of the testbench components. For example, the exemplary system 100 and the context-based actions controller 102 may control actions of the testbench components present within the test environment, by the process discussed herein. In particular, as will be appreciated by those of ordinary skill in the art, control logic and/or automated routines for performing the techniques and steps described herein may be implemented by the system 100 and the context-based actions controller 102 either by hardware, software, or combinations of hardware and software. For example, suitable code may be accessed and executed by the processor in the context-based actions controller 102 to perform some or all of the techniques described herein. Similarly, application specific integrated circuits (ASICs) configured to perform some, or all the processes described herein may be included in the processor in the context-based actions controller 102.

Figure 3:
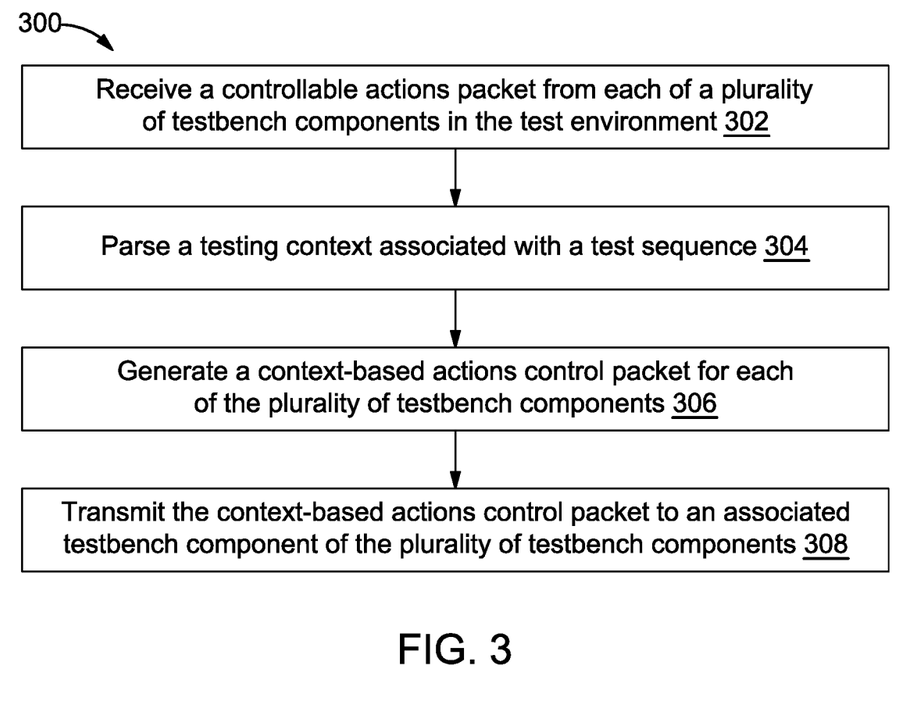
FIG. 3 is a flowchart of a method for controlling actions of testbench components present within a test environment based on a testing context, in accordance with an embodiment.

Referring now to FIG. 3, a method for controlling actions of testbench components present within a test environment based on a testing context is depicted via a flowchart 300, in accordance with an embodiment. Each step of the method may be executed by an actions controller (same as the context-based actions controller 200). FIG. 3 is explained in conjunction with FIGS. 1-2.

At step 302, a controllable actions packet may be received from each of a plurality of testbench components in the test environment. With reference to FIG. 1, each of the plurality of testbench components may correspond to 'the Interface 1 monitor 106', 'the Interface 1 driver 108', 'the Interface 2 monitor 110', 'the interface 2 driver 112', 'the interface 3 monitor 114', 'the interface 4 monitor 116', and 'the scoreboard-1 118'. Examples of the testbench components may include, but are not limited to, an agent, a sequencer, a driver, a monitor, a scoreboard, a checker, and a coverage collector. In should be noted that, selection of each of the plurality of testbench components may depend upon a DUT being tested in the test environment and the simulation. Further, to receive controllable actions packets, a components actions registry (similar to the components actions registry 204) may be employed. The controllable actions packet may include a list of controllable actions corresponding to a testbench component. Also, the controllable actions packet may include a unique name of the associated testbench component and an object handle to access the testbench component.

Further, at step 304, a testing context (same as the testing context 212) associated with a test sequence (for example, the test sequence 214) may be parsed. As will be appreciated, the testing context may be parsed through a context parsing module (analogous to the context parsing module 202) of the actions controller. It should be noted that the testing context may be parsed to generate testing context metadata. In some embodiments, the testing context may be received through the test sequence. The test sequence may be provided by a user.

At step 306, a context-based actions control packet may be generated for each of the plurality of testbench components. In an embodiment, the context-based actions control packet may be generated through an expectation generation module (for example, the expectation generation module 206) of the actions controller. It should be noted that the testing context metadata and the list of controllable actions corresponding to each of the plurality of testbench components may be considered for generating the respective context-based actions control packet. Generation of the context-based actions control packet is explained further in detail in conjunction with FIG. 4.

After that, at step 308, the context-based actions control packet may be transmitted to an associated testbench component from the plurality of testbench components. In an embodiment, the context-based actions control packet may be transmitted to the associated testbench component based on the retrieved object handle. An expectation loading module (same as the expectation loading module 208) may be used to transmit the context-based actions control packet. It should be noted that the context-based actions control packet may include one or more action control settings. In an embodiment, the one or more actions control settings may correspond to the expectations settings. Further, the one or more control settings may define the one or more actions required to be performed by the associated testbench component. In some embodiments, the one or more action control settings corresponding to the plurality of testbench components may be derived based on the testing context and the list of controllable actions received corresponding to each of the plurality of testbench components.

Examples of the one or more actions control settings may include, but are not limited to, signaling a testbench component (e.g., the interface 1 driver 108) to do appropriate logging based on whether the simulation is long running or short-running, signaling the testbench component (e.g., the interface 1 monitor 110) to not expect any transaction on respective interface and report an error upon noticing the transaction, signaling the testbench component (e.g., the interface 2 driver) to report an error if it is not able to send a specific number of packets that are expected to be sent into a DUT (same as the DUT 104) before the simulation ends, signaling the testbench component (e.g., the scoreboard-1 118) to perform check with respect to one or more errors injected into the DUT 104 during the simulation, signaling the testbench component (i.e., the scoreboard-1 118) to expect a specific number of DUT output packets and report an error if it does not see the specified number of output packets before the end of the simulation, signaling the testbench component to enable wave dump generation based on the criticality of the simulation, and the like.

Further, in some embodiments, during the simulation, an action control setting from the one or more action control settings may be re-configured. The one or more action control settings may be defined for performing an action from the one or more actions corresponding to the testbench component based on the testing context received from the user. By way of an example, when the action control setting corresponds to "signaling the testbench component (e.g., the interface 2 driver) to report the error if it is not able to send the specific number of packets that are expected to be sent into the DUT, then the 'Interface 2 driver' may keep track of total number of packets sent to the DUT and report the error in case of any issue (example: less number of packets sent than the expected number of packets to be sent). Transmission of the context-based actions control packet is further explained in conjunction with FIG. 5.

Figure 4:
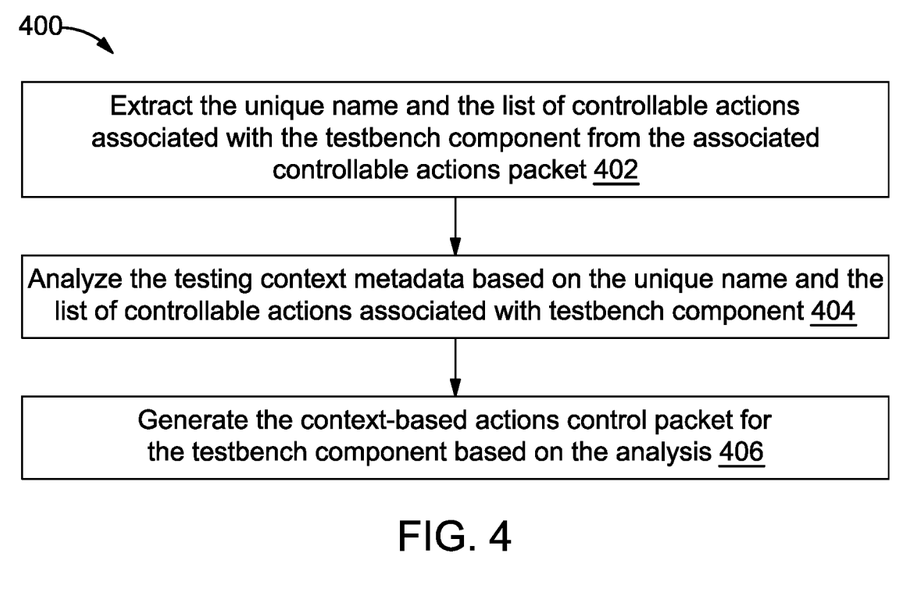
FIG. 4 is a flowchart of a method generating a context-based actions control packet for a testbench component, in accordance with an embodiment.

Referring now to FIG. 4, a method for generating a context-based actions control packet for a testbench component is depicted via a flowchart 400, in accordance with an embodiment. With reference to FIG. 2, each step of the method is performed using the expectation generation module 206 of the context-based actions controller (same as the actions controller). FIG. 4 is explained in conjunction with FIG. 3. In order to generate the context-based actions control packet as mentioned via step 306, at step 402, the unique name and the list of controllable actions associated with the testbench component may be extracted from the associated controllable actions packet. It should be noted that the controllable actions packet may be received from the corresponding testbench component at the start of the simulation. Further, with reference to FIG. 2, the controllable actions packet initially received from each of the plurality of testbench components may be stored in the components actions registry 204 of the context-based actions controller 200 (i.e., the actions controller).

Upon extracting the unique name and the list of controllable actions associated with the testbench component, at step 404, the testing context metadata may be analyzed. In an embodiment, the testing context metadata may be analyzed based on the unique name and the list of controllable actions associated with the testbench component. At step 406, the context-based actions control packet may be generated for the testbench component based on the analysis. As will be appreciated, for ease of explanation, the generation of one context-based actions control packet corresponding to one testbench component is explained. However, in a similar manner, the context-based actions control packet may be generated for each of the plurality of testbench components present in the test environment.

Figure 5:
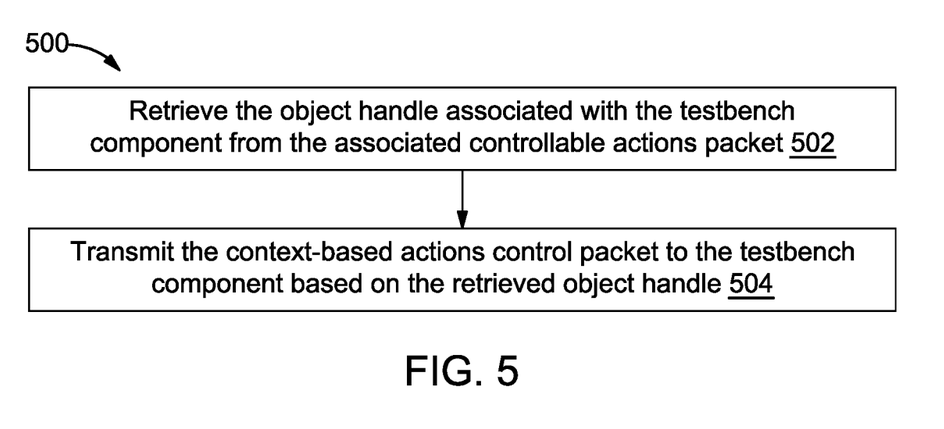
FIG. 5 is a flowchart of a method for transmitting a context-based actions control packet to a testbench component, in accordance with an embodiment.

Referring now to FIG. 5, a method for transmitting a context-based actions control packet to a testbench component is depicted via a flowchart 500, in accordance with an embodiment. With reference to FIG. 2, each step of the method is performed using the expectation loading module 208 of the context-based actions controller 200 (i.e., the actions controller). FIG. 5 is explained in conjunction with FIG. 3. Once the context-based actions control packet is generated as mentioned via the step 306, at step 502, the object handle associated with the testbench component may be retrieved from the associated controllable actions packet. In an embodiment, the object handle may correspond to an address with which the respective testbench component is accessed. After that, at step 504, based on the retrieved object handle, the context-based actions control packet may be transmitted to the respective testbench component.

Figure 6:
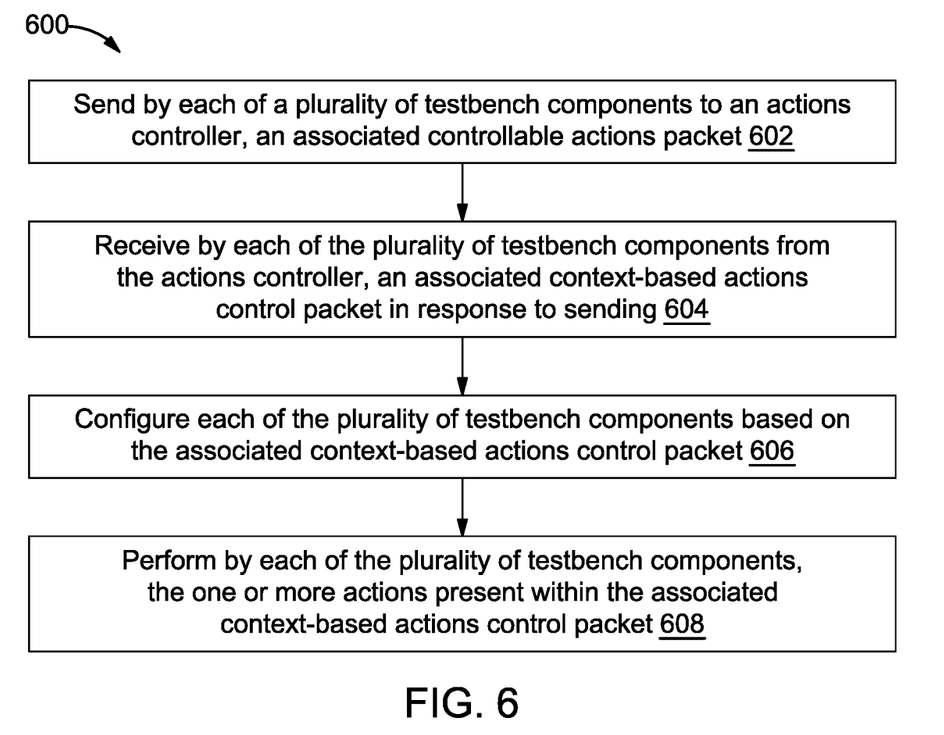
FIG. 6 is a flowchart of a method for performing actions through testbench components present within a test environment based on a testing context, in accordance with an embodiment.

Referring now to FIG. 6, a method for performing actions through testbench components present within a test environment based on a testing context is depicted via a flowchart 600, in accordance with an embodiment. Each step of the method is performed by the system 100. FIG. 6 is explained in conjunction with FIGS. 1-5.

At step 602, an associated controllable actions packet may be sent from each of a plurality of testbench components to an actions controller (same as the context-based actions controller 102). The controllable actions packet may include a list of controllable actions corresponding to a testbench component. In addition to the list of controllable actions, the controllable actions packet may include a unique name of the associated testbench component and an object handle to access the testbench component. Upon sending the corresponding controllable actions packets, at step 604, each of the plurality of testbench components may receive an associated context-based actions control packet from the actions controller, in response to sending.

The context-based actions control packet may include one or more actions to be performed by the testbench component. Further, it should be noted that the context-based actions control packet may be generated for each of the plurality of testbench components. To generate the context-based actions control packet, testing context metadata and the list of controllable actions corresponding to each of the plurality of testbench components may be taken into consideration. Moreover, the testing context metadata may be generated based on a testing context associated with a test sequence received from a user.

As will be appreciated, upon receiving the controllable actions packet from each of the plurality of testbench components, the actions controller may be configured to generate the context-based actions control packet corresponding to each of the plurality of testbench components. The method of generating the context-based actions control packet corresponding to each of the plurality of testbench components has been already explained in detail in reference to FIG. 4. Once the context-based actions control packet is generated for each of the plurality of testbench components, the actions controller may transmit the context-based actions control packet to the corresponding testbench component. In an embodiment, the context-based actions control packet may be transmitted based on the object handle associated with the respective testbench component from the plurality of testbench components. The method of transmitting the context-based actions control packet to the corresponding testbench component has been already explained in detail in conjunction with FIG. 5.

Thereafter, at step 606, each of the plurality of testbench components may be configured based on the associated context-based actions control packet. Once configured, at step 608, each of the plurality of testbench components may perform the one or more actions present within the associated context-based actions control packet.

Figure 7:
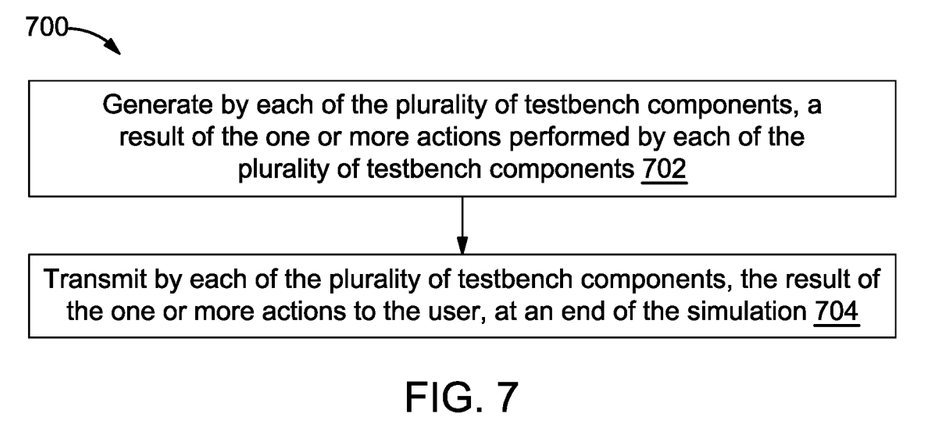
FIG. 7 is a flowchart of a method for transmitting the result of one or more actions performed by a plurality of testbench components to a user, in accordance with an embodiment.

Referring now to FIG. 7, a method for transmitting results of one or more actions performed by a plurality of testbench components to a user is depicted via a flowchart 700, in accordance with an embodiment. FIG. 7 is explained in conjunction with FIG. 6. At step 702, a result of the one or more actions performed by each of the plurality of testbench components may be generated. By way of an example, the results may correspond to an error flagged by the testbench component, when the testbench component is not able to process a specified number of packets before the end of the simulation. For example, suppose the testbench component, e.g., an Interface Driver (same as the interface 2 Driver 112) receives an action for 'sending 200 packets to a DUT (same as the DUT 104)' via the corresponding context-based actions control packet. Then in this case, the Interface 2 driver 112 may be configured to perform the action of sending 200 packets to the DUT. Now suppose, the Interface 2 driver 112 might only be able to send only 150 packets to the DUT during the simulation. Then, at the end of the simulation, the Interface 2 driver 112 may generate an error (i.e., the result) upon determining a failure in sending 200 packets to the DUT during the simulation.

Further, at step 704, the result generated corresponding to the one or more actions performed by each of the plurality of testbench components may be transmitted to the user, at the end of the simulation. By way of an example, the error generated by the Interface 2 driver 112 upon determining failure in sending 200 packets to the DUT based on monitoring, may be transmitted to the user.

Figure 8:
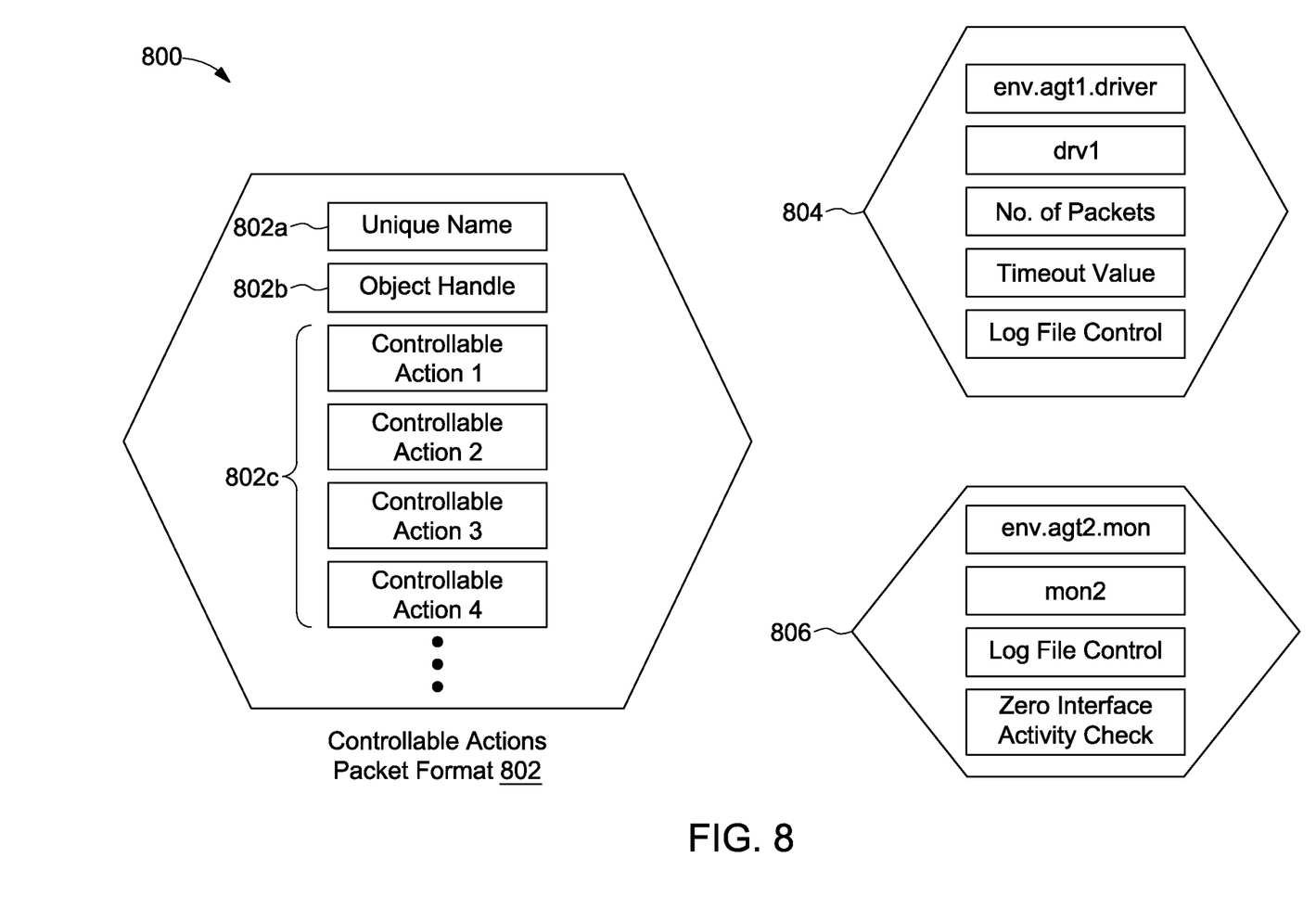
FIG. 8 illustrates a controllable actions packet format and exemplary controllable actions packets, in accordance with an embodiment.

Referring now to FIG. 8, a controllable actions packet format 802 and exemplary controllable actions packets (for example, a controllable actions packet 804, and a controllable actions packet 806) are illustrated, in accordance with an embodiment. FIG. 8 is explained in conjunction with FIGS. 1-7. The controllable actions packet format 802 corresponding to a testbench component includes a unique name 802a of the testbench component, an object handle 802b to access the testbench component, and a list of controllable actions 802c (for example, a controllable action 1, a controllable action 2, a controllable action 3, and a controllable action 4) to be performed by the testbench component.

For example, consider that a controllable actions packet 804 may be transmitted by the "interface 1 driver 108" (the testbench component) to the actions controller (same as the context-based actions controller 200). The controllable actions packet 804 includes the unique name as "env.agt1.driver" corresponding to the interface 1 driver 108, and the object handle as "drv1" to access the interface 1 driver 108. Further, the list of controllable actions to be performed by the "interface 1 driver 108" within the controllable actions packet 804 includes "number of packets", "timeout value", and "log file control". Further, by way of another example, consider that a controllable actions packet 806 may be transmitted by the "interface 2 monitor 106" to the actions controller. As depicted, the controllable actions packet 806 includes the unique name as "env.agt2.mon" of the "Interface 2 monitor 110", and the object handle as "mon2" to access the "interface 2 monitor 110". The list of controllable actions to be performed by the "interface 2 monitor 110" within the controllable actions packet 806 includes "log file control", and "zero interface activity check".

Figure 9:
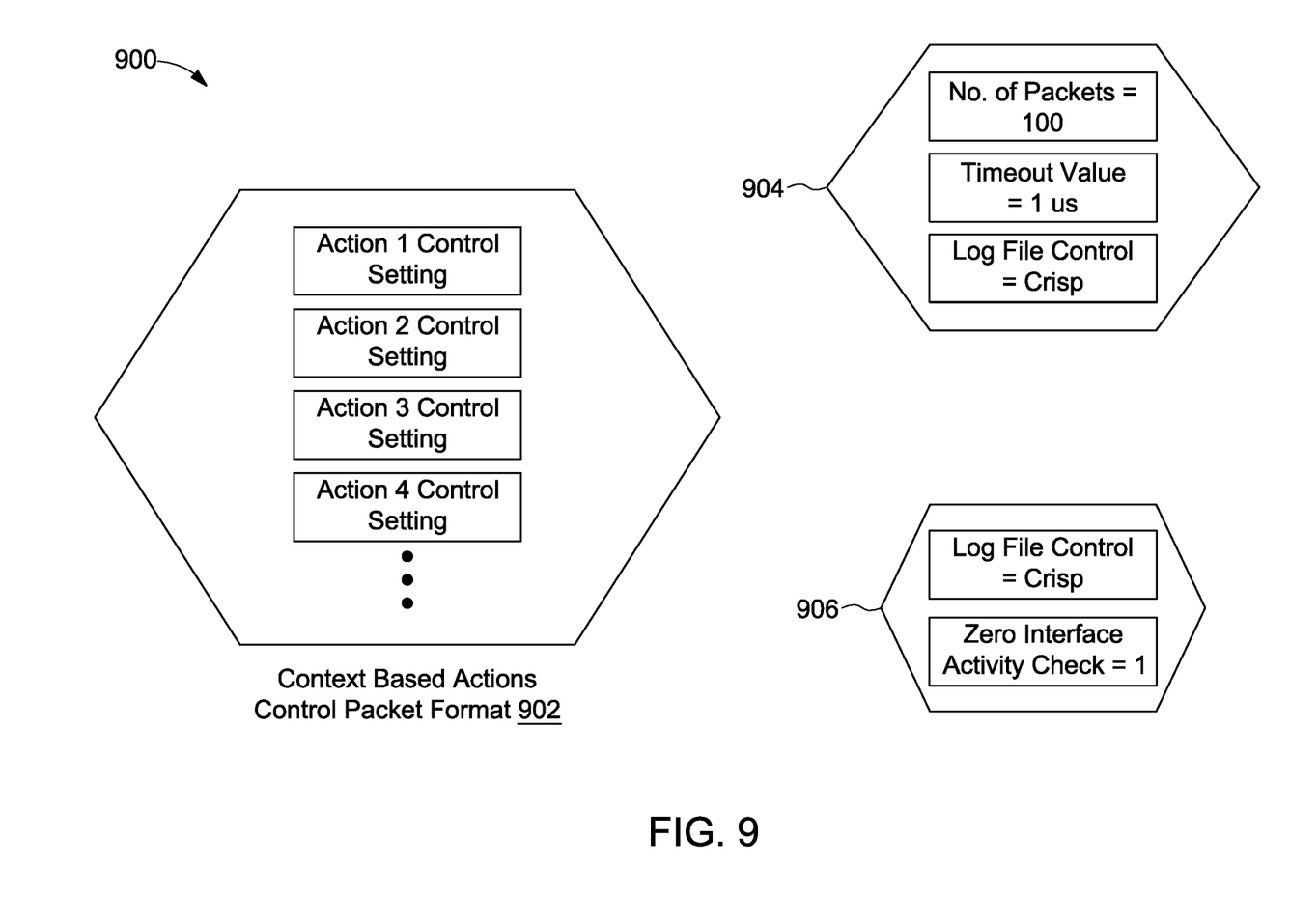
FIG. 9 illustrates a context-based actions control packets format and exemplary context-based actions control packets, in accordance with an embodiment.

Referring now to FIG. 9, a context-based actions control packet format 902 and exemplary context-based actions control packets (for example, a context-based actions control packet 904, and a context-based actions control packet 906) are illustrated, in accordance with an embodiment. FIG. 9 is explained in conjunction with FIGS. 1-8. The context-based actions control packet format 902 includes one or more action control settings (such as an action 1 control setting, an action 2 control setting, an action 3 control setting, an action 4 control setting) which define actions required to be performed by the associated testbench component. It should be noted that, the context-based actions control packet format 902 may include any number of actions control settings based on the list of controllable actions associated with the testbench component. By way of an example, the context-based actions controller may signal a testbench component via the corresponding context-based actions control packet to enable wave dump generation based on criticality of the simulation. As will be appreciated, the signal may correspond to an action control setting.

With reference to the examples explained in FIG. 8, a context-based actions control packet 904, and a context-based actions control packet 906 may be generated by the actions controller for the "Interface 1 driver 108", and "the interface 2 monitor 110", respectively, upon receiving the corresponding controllable actions packets 804, and 806 from the "Interface 1 driver 108", and "the interface 2 monitor 110", respectively. It should be noted that the context-based actions control packet 904 may be generated based on the unique name "env.agt1.driver", the controllable actions "number of packets", "timeout value", "log file control" associated with the "Interface 1 driver 108", and the testing context metadata. By way of an example, as depicted via present FIG. 9, the context-based actions control packet 904 includes three actions control settings as "no. of packets=100", "time out value=1 µs", and "log file control=crisp". These three action control settings define the actions required to be performed by the "interface 1 driver 108".

Further, it should also be noted that the context-based actions control packet 906 may be generated based on the unique name "env.agt2.mon", the controllable actions, i.e., "log file control", and "zero interface activity check" associated with the "Interface 2 monitor 110", and the testing context metadata. By way of another example, the context-based actions control packet 906 includes two actions control settings as "log file control=crisp", and "zero interface activity check=1". These two actions control settings define the actions required to be performed by the "interface 2 monitor 110". The context-based actions control packets 904 and 906 may be transmitted by the actions controller to the "interface 1 driver 108" and "interface 2 monitor 110", respectively, based on the associated object handles "drv1" and "mon2".

Figure 10:
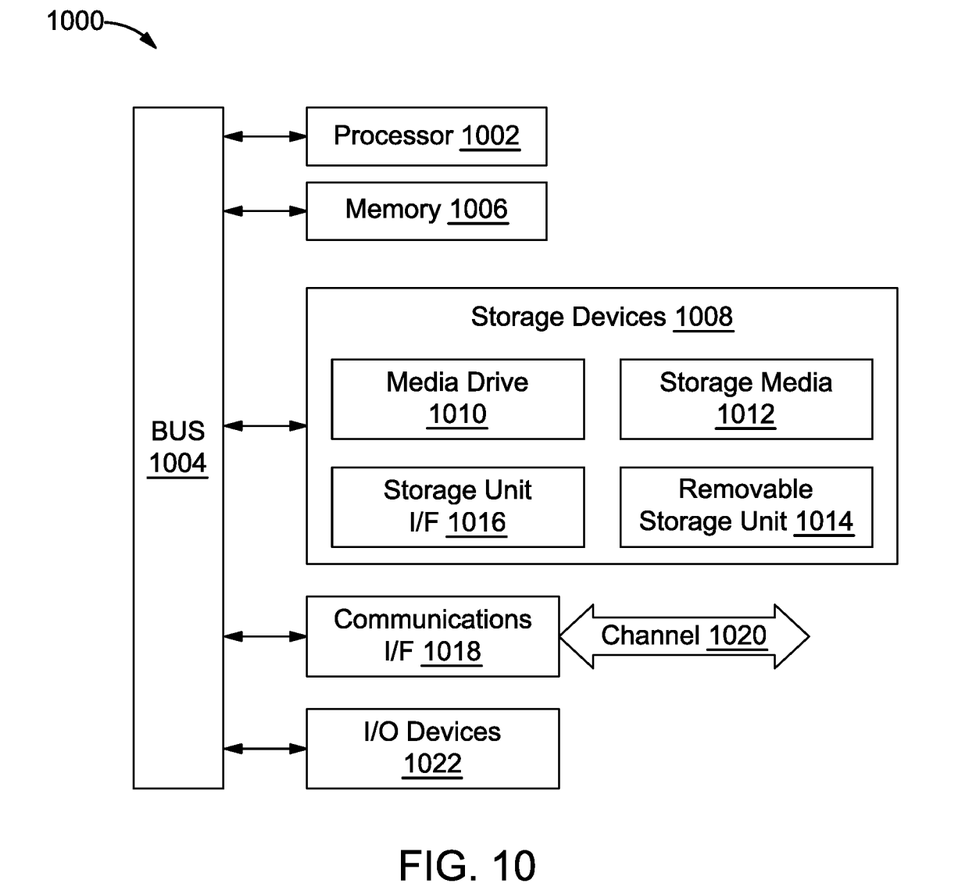
FIG. 10 is a block diagram of an exemplary computer system for implementing embodiments consistent with the present disclosure.

The disclosed methods and systems may be implemented on a conventional or a general-purpose computer system, such as a personal computer (PC) or server computer. Referring now to FIG. 10, an exemplary computing system 1000 that may be employed to implement processing functionality for various embodiments (e.g., as a SIMD device, client device, server device, one or more processors, or the like) is illustrated. Those skilled in the relevant art will also recognize how to implement the invention using other computer systems or architectures. The computing system 1000 may represent, for example, a user device such as a desktop, a laptop, a mobile phone, personal entertainment device, DVR, and so on, or any other type of special or general-purpose computing device as may be desirable or appropriate for a given application or environment. The computing system 1000 may include one or more processors, such as a processor 1002 that may be implemented using a general or special purpose processing engine such as, for example, a microprocessor, microcontroller or other control logic. In this example, the processor 1002 is connected to a bus 1004 or other communication medium. In some embodiments, the processor 1002 may be an Artificial Intelligence (AI) processor, which may be implemented as a Tensor Processing Unit (TPU), or a graphical processor unit, or a custom programmable solution Field-Programmable Gate Array (FPGA).

The computing system 1000 may also include a memory 1006 (main memory), for example, Random Access Memory (RAM) or other dynamic memory, for storing information and instructions to be executed by the processor 1002. The memory 1006 also may be used for storing temporary variables or other intermediate information during execution of instructions to be executed by the processor 1002. The computing system 1000 may likewise include a read only memory ("ROM") or other static storage device coupled to bus 1004 for storing static information and instructions for the processor 1002.

The computing system 1000 may also include a storage device 1008, which may include, for example, a media drives 1010 and a removable storage interface. The media drive 1010 may include a drive or other mechanism to support fixed or removable storage media, such as a hard disk drive, a floppy disk drive, a magnetic tape drive, an SD card port, a USB port, a micro USB, an optical disk drive, a CD or DVD drive (R or RW), or other removable or fixed media drive. A storage media 1012 may include, for example, a hard disk, magnetic tape, flash drive, or other fixed or removable medium that is read by and written to by the media drive 1010. As these examples illustrate, the storage media 1012 may include a computer-readable storage medium having stored there in particular computer software or data.

In alternative embodiments, the storage devices 1008 may include other similar instrumentalities for allowing computer programs or other instructions or data to be loaded into the computing system 1000. Such instrumentalities may include, for example, a removable storage unit 1014 and a storage unit interface 1016, such as a program cartridge and cartridge interface, a removable memory (for example, a flash memory or other removable memory module) and memory slot, and other removable storage units and interfaces that allow software and data to be transferred from the removable storage unit 1014 to the computing system 1000.

The computing system 1000 may also include a communications interface 1018. The communications interface 1018 may be used to allow software and data to be transferred between the computing system 1000 and external devices. Examples of the communications interface 1018 may include a network interface (such as an Ethernet or other NIC card), a communications port (such as for example, a USB port, a micro USB port), Near field Communication (NFC), etc. Software and data transferred via the communications interface 1018 are in the form of signals which may be electronic, electromagnetic, optical, or other signals capable of being received by the communications interface 1018. These signals are provided to the communications interface 1018 via a channel 1020. The channel 1020 may carry signals and may be implemented using a wireless medium, wire or cable, fiber optics, or other communications medium. Some examples of the channel 1020 may include a phone line, a cellular phone link, an RF link, a Bluetooth link, a network interface, a local or wide area network, and other communications channels.

The computing system 1000 may further include Input/Output (I/O) devices 1022. Examples may include, but are not limited to a display, keypad, microphone, audio speakers, vibrating motor, LED lights, etc. The I/O devices 1022 may receive input from a user and also display an output of the computation performed by the processor 1002. In this document, the terms "computer program product" and "computer-readable medium" may be used generally to refer to media such as, for example, the memory 1006, the storage devices 1008, the removable storage unit 1014, or signal(s) on the channel 1020. These and other forms of computer-readable media may be involved in providing one or more sequences of one or more instructions to the processor 1002 for execution. Such instructions, generally referred to as "computer program code" (which may be grouped in the form of computer programs or other groupings), when executed, enable the computing system 1000 to perform features or functions of embodiments of the present invention.

In an embodiment where the elements are implemented using software, the software may be stored in a computer-readable medium and loaded into the computing system 1000 using, for example, the removable storage unit 1014, the media drive 1010 or the communications interface 1018. The control logic (in this example, software instructions or computer program code), when executed by the processor 1002, causes the processor 1002 to perform the functions of the invention as described herein.

Various embodiments provide method and system for controlling actions of testbench components present within a test environment based on a testing context. The disclosed method and system may receive a controllable actions packet from each of a plurality of testbench components in the test environment. The controllable actions packet may include a list of controllable actions corresponding to a testbench component. Further, the disclosed method and system may parse a testing context associated with a test sequence. The testing context may be parsed to generate testing context metadata. Further, the disclosed method and system may generate a context-based actions control packet for each of the plurality of testbench components, based on the testing context metadata and the list of controllable actions corresponding to each of the plurality of testbench components. Thereafter, the disclosed method and system may transmit the context-based actions control packet to an associated testbench component of the plurality of testbench components. The context-based actions control packet may include one or more actions to be performed by the associated testbench component.

The disclosure further provides the context-based actions controller which processes the testing context associated with the test sequence and controllable actions packets, generates the expectation settings or the action control settings for each of the testbench components in the test environment appropriately. The testing context needs to be set by the user in advance for the simulation (test). The testing context may include, but is not limited to, the number of packets to be used for different DUT input interfaces, type of the test (i.e., a long running test or a short running test), criticality of the test (for example, critical/non-critical test), tested interface/function, and any special information about the test.

In one example, the testing context includes "Interface1 only test, 75 input packets, short running test, interface 2 inactive". In one example, the testing context includes "critical test, enable wave dump". In one example, the testing context includes "Interface2 error test". In one example, the testing context includes "long running test, optimal logging". In one example, the testing context includes "sanity test, no DUT output".

Further, the expectation settings, i.e., the action control settings may be provided by the actions controller. By way of an example, the actions controller may send a signal to an interface driver (i.e., a testbench component) to perform appropriate logging based on the criticality of the test or whether it is long or short-running test, as with the long running tests, the logging needs to be crisp so that the disk space required for storing the log files is reduced.

The disclosed method and system may help to automate the process of controlling the actions of testbench components present within a test environment based on the testing context, thereby adding a value to testing based on the testing context. Further, the disclosure helps in reducing human efforts, and errors while performing the test (i.e., the simulation). Additionally, the disclosure can be used across any of the existing industry standard verification methodologies.

It will be appreciated that, for clarity purposes, the above description has described embodiments of the invention with reference to different functional units and processors. However, it will be apparent that any suitable distribution of functionality between different functional units, processors or domains may be used without detracting from the invention. For example, functionality illustrated to be performed by separate processors or controllers may be performed by the same processor or controller. Hence, references to specific functional units are only to be seen as references to suitable means for providing the described functionality, rather than indicative of a strict logical or physical structure or organization.

Although the present invention has been described in connection with some embodiments, it is not intended to be limited to the specific form set forth herein. Rather, the scope of the present invention is limited only by the claims. Additionally, although a feature may appear to be described in connection with particular embodiments, one skilled in the art would recognize that various features of the described embodiments may be combined in accordance with the invention.

Furthermore, although individually listed, a plurality of means, elements or process steps may be implemented by, for example, a single unit or processor. Additionally, although individual features may be included in different claims, these may possibly be advantageously combined, and the inclusion in different claims does not imply that a combination of features is not feasible and/or advantageous. Also, the inclusion of a feature in one category of claims does not imply a limitation to this category, but rather the feature may be equally applicable to other claim categories, as appropriate.

What is claimed is:

1. A method for controlling actions of testbench components present within a test environment based on a testing context, the method comprising:
   receiving, by an actions controller, a controllable actions packet from each of a plurality of testbench components in the test environment, wherein the controllable actions packet comprises a list of controllable actions corresponding to a testbench component;
   parsing, by the actions controller, a testing context associated with a test sequence, wherein the testing context is parsed to generate testing context metadata;
   generating, by the actions controller, a context-based actions control packet for each of the plurality of testbench components, based on the testing context metadata and the list of controllable actions corresponding to each of the plurality of testbench components; and
   transmitting, by the actions controller, the context-based actions control packet to an associated testbench component of the plurality of testbench components, wherein the context-based actions control packet comprises one or more actions to be performed by the associated testbench component.

2. The method of claim 1, further comprising receiving the testing context along with the test sequence, wherein the testing context is provided by a user.

3. The method of claim 1, wherein the controllable actions packet further comprises a unique name of the associated testbench component and an object handle to access the testbench component.

4. The method of claim 3, wherein generating the context-based actions control packet for a testbench component from the plurality of testbench components comprises:
   extracting the unique name and the list of controllable actions associated with the testbench component from the associated controllable actions packet;
   analyzing the testing context metadata based on the unique name and the list of controllable actions associated with testbench component; and
   generating the context-based actions control packet for the testbench component based on the analysis.

5. The method of claim 3, wherein transmitting the context-based actions control packet to the testbench component from the plurality of testbench components comprises:
   retrieving the object handle associated with the testbench component from the associated controllable actions packet; and
   transmitting the context-based actions control packet to the testbench component based on the retrieved object handle.

6. The method of claim 1, wherein the context-based actions control packet comprises one or more action control settings defining the one or more actions required to be performed by the associated testbench component.

7. The method of claim 6, further comprising:
   deriving the one or more action control settings corresponding to the plurality of testbench components based on the testing context and the list of controllable actions received corresponding to each of the plurality of testbench components.

8. The method of claim 6, further comprising re-configuring, during the simulation, an action control setting from the one or more action control settings defined for performing an action from the one or more actions corresponding to the testbench component based on the testing context received from the user.

9. A system for controlling actions of testbench components present within a test environment based on a testing context, the system comprising:
   a processor; and
   a memory communicatively coupled to the processor, wherein the memory stores processor-executable instructions, which, on execution, causes the processor to:
   receive a controllable actions packet from each of a plurality of testbench components in the test environment, wherein the controllable actions packet comprises a list of controllable actions corresponding to a testbench component;
   parse a testing context associated with a test sequence, wherein the testing context is parsed to generate testing context metadata;
   generate a context-based actions control packet for each of the plurality of testbench components, based on the testing context metadata and the list of controllable actions corresponding to each of the plurality of testbench components; and
   transmit the context-based actions control packet to an associated testbench component of the plurality of testbench components, wherein the context-based actions control packet comprises one or more actions to be performed by the associated testbench component.

10. The system of claim 9, wherein the processor-executable instructions cause the processor to receive the testing context along with the test sequence, wherein the testing context is provided by a user.

11. The system of claim 9, wherein the controllable actions packet further comprises a unique name of the associated testbench component and an object handle to access the testbench component.

12. The system of claim 11, wherein the processor-executable instructions cause the processor to generate the context-based actions control packet for a testbench component from the plurality of testbench components by:

extracting the unique name and the list of controllable actions associated with the testbench component from the associated controllable actions packet;

analyzing the testing context metadata based on the unique name and the list of controllable actions associated with testbench component; and generating the context-based actions control packet for the testbench component based on the analysis.

13. The system of claim 11, wherein the processor-executable instructions cause the processor to transmit the context-based actions control packet to the testbench component from the plurality of testbench components by:

retrieving the object handle associated with the testbench component from the associated controllable actions packet; and transmitting the context-based actions control packet to the testbench component based on the retrieved object handle.

14. The system of claim 9, wherein the context-based actions control packet comprises one or more action control settings defining the one or more actions required to be performed by the associated testbench component.

15. The system of claim 14, wherein the processor-executable instructions cause the processor to:

derive the one or more action control settings corresponding to the plurality of testbench components based on the testing context and the list of controllable actions received corresponding to each of the plurality of testbench components.

16. The system of claim 14, wherein the processor-executable instructions cause the processor to re-configure, during the simulation, an action control setting from the one or more action control settings defined for performing an action from the one or more actions corresponding to the testbench component based on the testing context received from the user.

* * * * *